United States Patent [19]
Byrne et al.

[11] Patent Number: 4,833,102

[45] Date of Patent: May 23, 1989

[54] PROCESS OF MAKING A CERAMIC LID FOR USE IN A HERMETIC SEAL PACKAGE

[75] Inventors: Robert C. Byrne, Sunnyvale; Jon T. Ewanich, San Jose, both of Calif.; Chee-Men Yu, Singapore, Taiwan

[73] Assignee: National Semiconductor Corporation, Santa Clara, Calif.

[21] Appl. No.: 204,477

[22] Filed: Jun. 9, 1988

Related U.S. Application Data

[62] Division of Ser. No. 26,912, Mar. 17, 1987, Pat. No. 4,769,272.

[51] Int. Cl.⁴ .............................................. H01L 21/00
[52] U.S. Cl. ..................................... 437/218; 437/226; 357/80; 174/50.51; 174/52.3; 361/331
[58] Field of Search ............... 437/218, 214, 209, 211; 29/837, 842, 844, 829

[56] References Cited

U.S. PATENT DOCUMENTS 4,291,815  9/1981  Gordon et al. ..................... 437/218

FOREIGN PATENT DOCUMENTS 0194545  10/1985  Japan ................................. 437/218
0156842   7/1986  Japan ................................. 437/218

*Primary Examiner*—Brian E. Hearn
*Assistant Examiner*—Beverly A. Pawlikowski
*Attorney, Agent, or Firm*—Gail W. Woodward; Lee Patch; Mark Aaker

[57] ABSTRACT

A sidebrazed ceramic package is provided with a closure seal that employs a high alumina ceramic lid that matches the composition of the package body. The lid is provided with a recess in the sealing face and the sealing face is provided with metallization that adheres to the ceramic and is wet by solder. The metallized ceramic lid is sealed to the metallization ring on the sidebrazed ceramic body by means of the conventional gold-tin solder. The resultant hermetic seal can be inspected by observing the solder fillet in the lid recess. Such a closure seal is fully hermetic and can readily survive repeated thermal cycling.

9 Claims, 1 Drawing Sheet

U.S. Patent  May 23, 1989  4,833,102
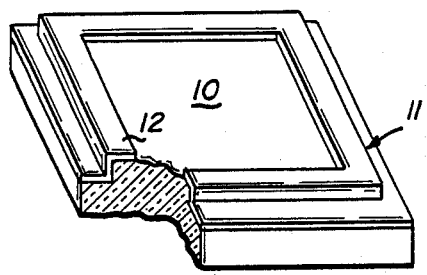
FIG_1
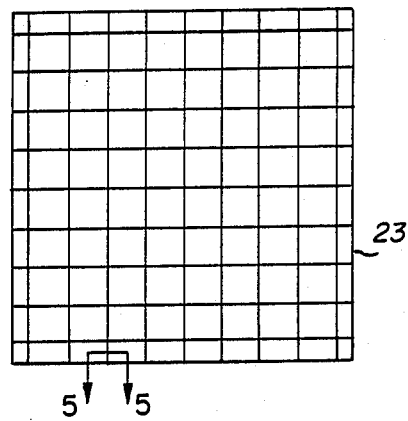
FIG_4
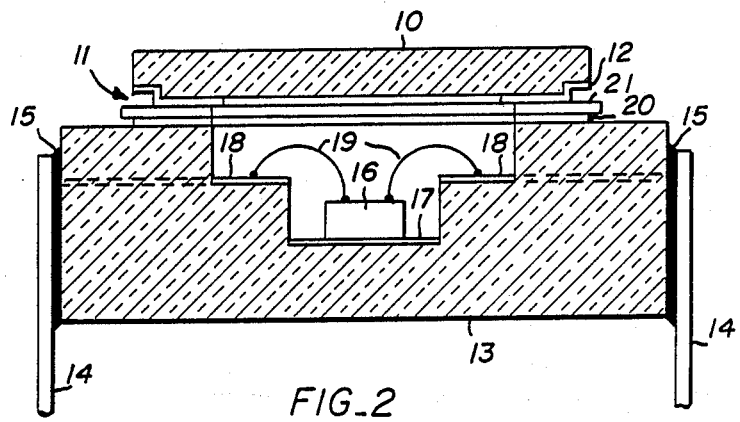
FIG_2
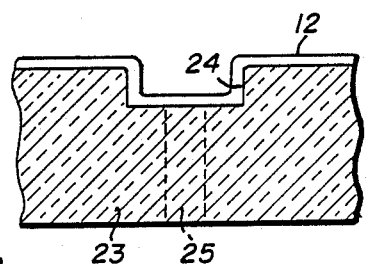
FIG_5
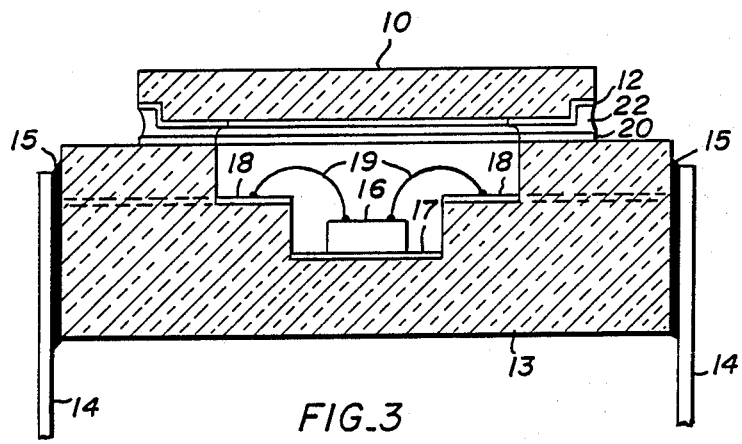
FIG_3
FIG_6
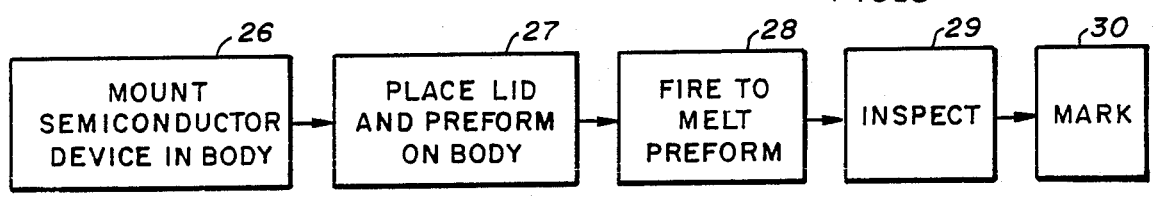

PROCESS OF MAKING A CERAMIC LID FOR USE IN A HERMETIC SEAL PACKAGE

This is a divisional of application Ser. No. 026,912, filed on Mar. 17, 1987, now U.S. Pat. No. 4,769,272.

BACKGROUND OF THE INVENTION

The invention relates to hermetic packages that are commonly used to house semiconductor devices. One such device is known in the semiconductor industry as the ceramic side brazed dual in-line package. The package is of rectangular shape and has two rows of metal pins brazed to the sides thereof. A recess located in the body of the package receives a semiconductor device and means are provided for connecting the device bonding pads to metal pathways incorporated into the package. These pathways conductively communicate with the side brazed pins. The package is finally hermetically sealed by welding or soldering a closure lid over the package recess.

The package recess is ordinarily surrounded by a metallization ring that adheres to the ceramic. A solder preform is placed over the ring and a metal cap placed on top of the solder preform. The assembly is then heated to melt the solder which wets the metal lid and the metallization. Upon cooling the solder will secure the cap to the package. The metal cap is usually composed of a metal alloy of nickel, iron, cobalt and manganese known as Kovar which is compatible with the ceramic to which it is attached. To avoid corrosion problems the lid is ordinarily plated with nickel and then gold. The solder preform is composed of a gold-tin alloy which melts at about 280° C. Alternatively, the lid can be composed of an environmentally resistant metal such as alloys of nickel, titanium, tantalum, niobium or tungsten or it may be composed of stainless steel. After the lid is soldered to the ceramic body it is imprinted with the device identification and other desired information such as the manufacturer and assembly date code.

The requirements of the metal lid are severe. The final surface must be noncorrodable and capable of taking and retaining the marking. It must be compatible with the ceramic body and solderable thereto, while maintaining a hermetic seal throughout thermal and mechanical cycling. The conflicting requirements has resulted in a rather expensive and somewhat unreliable closure seal. It would be desirable to reduce the cost and increase the reliability of the closure lid for the ceramic package.

SUMMARY OF THE INVENTION

It is an object of the invention to provide a low cost ceramic lid for the closure seal of a ceramic package.

It is a further object of the invention to provide a process for manufacturing a low cost ceramic lid that is useful in producing a reliable closure seal for a ceramic package.

It is a still further object of the invention to provide a low cost ceramic lid for providing a reliable closure seal in a ceramic package and that will accept and retain the device markings.

It is a further object of the invention to provide a low cost ceramic lid which provides a reliable closure seal in a ceramic package, accepts and retains the device markings and that will maintain a corrosion-free lid in a harsh and salty environment.

These and other objects are achieved in the following manner. A high alumina ceramic lid is provided with a recess around its peripheral edge. The face with the recess is coated with metallization that covers the recess, adheres to the ceramic, and presents a solderable surface. The metallized lid is pressed against the metallization on a ceramic package with an interposed solder preform and the assembly heated to melt the solder. The solder will then wet the metal on the cap and the metal on the package so that a solder seal is created. The solder will form a fillet that will cling to the lid recess and thereby form a visible and reliable hermetic seal. The ceramic lid will hermetically seal the ceramic package and its outer surface will accept and retain the device marking. Since the ceramic lid expansion will match that of the package there are no strains induced in the closure seal during repeated temperature cycling and the closure seal is therefore highly reliable. Finally, the lid will survive harsh chemical environments.

BRIEF DESCRIPTION OF THE DRAWINGS

FIG. 1 is a drawing of a ceramic lid in accordance with the invention.

FIG. 2 is a cross-section of a ceramic package with a lid in place prior to sealing.

FIG. 3 is a cross-section of a ceramic package with a lid in place after sealing.

FIG. 4 shows a ceramic wafer used in lid manufacture.

FIG. 5 is a section of the wafer of FIG. 4 after metallization.

FIG. 6 is a block diagram showing package assembly.

DESCRIPTION OF THE INVENTION

In FIG. 1 a lid 10 is shown with one corner broken away to show the structure. Lid 10 is formed of 92-96% alumina which may include a pigment to provide a desired color. The lid is chamfered around its edge at 11 to create a recess. The lid face that includes the recess has a metallization layer 12. The opposing face of the lid will constitute the surface that extends away from the finished package. While the metallization is shown covering only a portion of the sealing face, it is to be understood that it could cover all of the sealing face.

In FIG. 2 a high alumina ceramic base 13 forms the body of a sidebrazed ceramic package. Pins 14 are brazed at 15 to the sides of body 13. A semiconductor device 16 is secured to metallization 17 in the bottom of a cavity located in body 13. A cavity shoulder includes metallization 18 that is interconnected with bonding pads on semiconductor device 16 by means of wire bonds 19. Shoulder metallization 18 is extended through body 13 as shown by the dashed lines to contact brazes 15. Thus, pins 14 are connected electrically to the semiconductor device 16 by metal lines buried within body 13.

Body 13 includes a ring of metallization 20 which surrounds the cavity therein. At this point in the description a conventional side brazed ceramic package is present. Conventional procedure would involve the soldering of a metal plate to metallization ring 20 to complete the hermetically sealed package.

In accordance with the invention a ceramic lid as shown in FIG. 1 is soldered to body 13. To this end a solder preform 21 is located between lid 10 and body 13 as illustrated in FIG. 2. FIG. 3 shows a cross-section of a package after soldering. The solder preform has melted to create a solder fillet 22. While other solders could be employed it is preferred that preform 21 be made of a eutectic alloy of gold and tin which melts at close to 280° C. Such a solder will permit the package to operate over 200° C. and will seal at temperatures that will not harm the semiconductor devices. Finally, such a solder is environmentally resistive and will not corrode in atmospheres that would adversely affect many of the more conventional solders.

As shown in FIG. 3, the solder has formed a fillet 22 that shows wetting of both the body 13 and lid 10 where metallization is present. The solder fillet is visible after soldering and its appearance can serve as a visual inspection of the soldering operation. The solder fillet clings to the lid metallization inside the recessed portion so as to create a good seal. Since body 13 and lid 10 are both composed of ceramic they expand and contract together when the finished package is temperature cycled. Thus, such cycling does not stress the solder seal so that no fatigue problems develop during repeated temperature cycling. It has been found that such ceramic lid seals are very rugged. While the well-known metal lids can be "popped off" of a ceramic package, the ceramic lids cannot. To effect the removal of a sealed ceramic lid it ordinarily must be fractured and removed in pieces.

FIG. 4 shows how a ceramic lid can be fabricated at low cost. A high alumina wafer 23 is the starting material which can be of low cost because the tolerance requirements are not severe. For example, 4-inch (about 102 mm) square wafers about 0.025-inch (about 0.635 mm) thick can be employed. A series of vertical and horizontal saw kerfs can be arranged as shown to extend part way (about ⅛ to 1/5) through the wafer and thereby create slots as shown in FIG. 5 which is a section showing of a portion of wafer 23. A relatively wide saw blade can be used to create kerf 24. For example, a 10-mil (0.254 mm) saw blade cutting to a depth of 5- to 8-mils (about 0.127 to 0.203 mm) will produce a suitable kerf. In the pattern shown, 64 lids 0.472-inch (about 12 mm) square can be produced from a single four-inch wafer.

After the saw kerfs are produced as shown, the sawed face is covered with metallization 12. While many metallization schemes are available it is preferred that a metallization paste be applied by silk screening. For example, a suspension of palladium-silver alloy particles in an organic binder and solvent (such as DuPont #9770) is thinned by adding solvent (such as DuPont #9180) to produce a paste consistency suitable for silk screening. The paste is silk screened onto the wafer and then dried at 150° C. for 10 minutes. If desired, a second such layer is silk screened onto the wafer and dried. When a suitable paste thickness is achieved, the wafer is fired for about 10 minutes at a peak temperature of about 870° C.±5° C. The high temperature firing is held for about one hour during which time the remaining organic material is burnt-off and the glass melted to produce a palladium silver particulate mass retained in a glass binder. The resulting layer 12 is conductive and adheres very well to the high alumina ceramic. The layer is also readily wet by conventional solder.

After the conductive layer 12 is fired onto the ceramic wafer, a Nikko tape with a metal holding ring (not shown) is applied to the unmetallized wafer face so the wafer can be, sawed into individual life. In this operation a thin saw blade, about 3-mils (about 0.077 mm) thick, is used to saw through the wafer (and part of the holding tape) at 25 as shown by the dashed lines in FIG. 5. It can be seen that the original saw kerfs create the desired edge recesses. After the final sawing the holding tape is removed with a suitable chemical solvent which leaves a group of metallized ceramic lids. Since the metallization is applied by silk screening, the operation can be employed to selectively apply the metal only to the region of the saw kerfs. Otherwise, the metallization completely covers the saw kerf side of the wafer.

In the semiconductor device packaging operation the process illustrated in FIG. 6 is employed to produce the structures of FIGS. 2 and 3. Preform 21 of FIG. 2 is preferred to be composed of about 80% gold and 20% tin. As indicated in block 26, the semiconductor device 16 is secured within the housing cavity by conventional means such as soldering or conductive adhesive. Then the semiconductor device bonding pads are connected to the housing conductors by means of aluminum or gold wires 19 or tape assembly bonded by means of copper spiders (not illustrated). Then the housing is located in a jig (also not illustrated) which presses a lid 10 in place over a preform 21 in accordance with block 27. Then the jig passes through a furnace that provides a peak temperature of about 340° C. for about 5 minutes. During this firing the solder seal shown at 22 in FIG. 3 is achieved to produce the effect shown in block 28. A visual inspection of the final seal completes the process as shown in block 29. The finished devices are marked as shown in block 30.

The invention has been described and a preferred process detailed. When a person skilled in the art reads the foregoing description, alternatives and equivalents within the spirit and intent of the invention, will be apparent. Accordingly, it is intended that the scope of the invention be limited only by the following claims:

We claim:

1. A process for fabricating a ceramic lid to be used in forming the closure seal in a hermetic ceramic package, said process including the steps:
    starting with a ceramic slab having flat opposing faces;
    forming a series of recesses in a first face of said slab that extend only part way through said slab, said recesses having a substantial predetermined width, said recesses being formed to outline a plurality of said ceramic lid structures;
    applying a layer of metallization to said first face after said recesses are formed therein so that said recesses are metallized; and
    cutting said wafer apart inside the confines of said recesses to form a plurality of individual lids having metallization in the thus produced peripheral edge recesses.

2. The process of claim 1 wherein said step of applying a layer of metallization comprises:
    forming a paste of metal particles, glass powder, binder and solvent;
    silk screening said paste onto said wafer; and
    firing said wafer to drive off said solvent and binder to leave a matrix of metal particles in a glass structure adhering to said ceramic.

3. The process of claim 2 wherein said silk screening applies said paste is applied to fully cover said first face of said ceramic slab.

4. The process of claim 2 wherein said silk screening applies to said recesses and to the immediately adjacent face portions.

5. The process of claim 1 wherein said forming step is accomplished by means of sawing.

6. The process of claim 5 wherein said cutting step is accomplished by sawing using a saw blade that is thin relative to the saw blade employed in said forming step.

7. The process for forming a closure seal in a hermetic ceramic package composed of high alumina ceramic body having a recess in a face thereof for containing an electronic device, said recess being surrounded by a metallization ring formed on said face, said process comprising the steps:
   forming a high alumina ceramic cap having a peripheral recess in one face thereof;
   forming a layer of metallization on said face of said cap wherein said recess is covered with said metallization;
   applying a solder preform to said ceramic body in registry with said metallization ring;
   placing said lid on said solder preform so that said metallization on said lid face contacts said solder preform; and
   firing said body with said solder preform and said lid in place so that said solder melts and secures said lid to said body to complete a hermetic seal.

8. The process of claim 7 wherein said metallization is composed of metal particles in a glass matrix and said solder is composed of a metal alloy that melts at a temperature compatible with said electronic device.

9. The process of claim 8 wherein said electronic device is a silicon integrated circuit, said metallization is composed of palladium-silver alloy particles and said solder alloy is composed of gold and tin.

* * * * *